(12) United States Patent
Park

(10) Patent No.: US 9,516,775 B2
(45) Date of Patent: Dec. 6, 2016

(54) FLEXIBLE DISPLAY APPARATUS INCLUDING CURVATURE CHANGING MEMBER

(71) Applicant: Samsung Display Co., Ltd., Yongin, Gyeonggi-Do (KR)

(72) Inventor: Kisoo Park, Cheonan-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/804,955

(22) Filed: Jul. 21, 2015

(65) Prior Publication Data
US 2016/0249475 A1 Aug. 25, 2016

(30) Foreign Application Priority Data
Feb. 24, 2015 (KR) .................. 10-2015-0025955

(51) Int. Cl.
*G02F 1/1333* (2006.01)
*H05K 7/02* (2006.01)
(52) U.S. Cl.
CPC ...................... *H05K 7/02* (2013.01)
(58) Field of Classification Search
CPC .............. H05K 7/02; G06F 2001/133322
See application file for complete search history.

(56) References Cited

U.S. PATENT DOCUMENTS

| 2013/0100392 A1 | 4/2013 | Fukushima | |
| 2013/0155655 A1* | 6/2013 | Lee | H05K 5/03 362/97.1 |
| 2014/0268584 A1* | 9/2014 | Song | H05K 7/02 361/728 |
| 2015/0009635 A1* | 1/2015 | Kang | G09F 9/301 361/749 |
| 2015/0346537 A1* | 12/2015 | Yu | G02F 1/133308 349/60 |
| 2016/0028042 A1* | 1/2016 | Lee | G02F 1/133305 361/749 |

(Continued)

FOREIGN PATENT DOCUMENTS

| JP | 2856710 B2 | 11/1998 |
| JP | 5408301 B2 | 11/2013 |

(Continued)

*Primary Examiner* — James Dudek
(74) *Attorney, Agent, or Firm* — Cantor Colburn LLP

(57) ABSTRACT

A display apparatus includes a display module including a flexible display panel, a curvature-changing member configured to adjust a curvature of the display module, and a bottom chassis in which is disposed the display module and the curvature-changing member. The curvature-changing member includes a wire, a first movement control part which moves the wire, a plurality of wire guiders through which the wire passes, disposed at predetermined intervals in a moving path of the wire to guide the moving path of the wire; and a plurality of wire stoppers which is coupled to the wire at predetermined intervals along a length of the wire limiting the movement of the wire along the moving path. In an unbent state of the curvature-changing member, intervals between adjacent wire guiders among the plurality of wire guiders are larger than intervals between adjacent wire stoppers among the plurality of wire stoppers.

18 Claims, 9 Drawing Sheets

(56) References Cited

U.S. PATENT DOCUMENTS

| 2016/0054512 A1* | 2/2016 | Zhou | G02B 6/0068 |
| | | | 362/613 |
| 2016/0109743 A1* | 4/2016 | Wu | G02F 1/13394 |
| | | | 349/42 |
| 2016/0192519 A1* | 6/2016 | Song | H05K 5/0017 |
| | | | 361/679.01 |

FOREIGN PATENT DOCUMENTS

| KR | 1020130117110 A | 10/2013 |
| KR | 10-1401196 A | 5/2014 |
| KR | 1020140130827 A | 11/2014 |

* cited by examiner

FLEXIBLE DISPLAY APPARATUS INCLUDING CURVATURE CHANGING MEMBER

This application claims priority to Korean Patent Application No. 10-2015-0025955, filed on Feb. 24, 2015, and all the benefits accruing therefrom under 35 U.S.C. §119, the content of which in its entirety is herein incorporated by reference.

BACKGROUND (1) Field

The invention relates to a display apparatus which includes a curvature-changing member configured to change a curvature of a display module.

(2) Description of the Related Art

As display apparatuses for implementing images, various types of displays have been used, such as liquid display panels, plasma display panels and organic light-emitting display panels.

As the application fields of display apparatuses are gradually expanded, various characteristics are being demanded in each application field, and demands for three-dimensional effect, immersive effect, etc., as well as characteristics related to simple image display, are being increased. To meet such various demands, research for improving the structures of display apparatuses in various shapes has been continuously carried out.

SUMMARY

One or more exemplary embodiment of the invention provides a display apparatus including a curvature-changing member for adjusting a curvature of a display module to improve immersive effect for a viewer.

An exemplary embodiment of the invention provides a display apparatus including: a display module including a flexible display panel; a curvature-changing member configured to adjust a curvature of the display apparatus; and a bottom chassis in which is disposed the display module and the curvature-changing member. The curvature-changing member includes a wire; a first movement control part which moves the wire; a plurality of wire guiders through which the wire passes, the plurality of wire guiders disposed at predetermined intervals in a moving path of the wire to guide the moving path of the wire; and a plurality of wire stoppers which is coupled to the wire at predetermined intervals along a length of the wire, the plurality of wire stoppers limiting the movement of the wire along the moving path. In an unbent state of the curvature-changing member, intervals between adjacent wire guiders among the plurality of wire guiders are larger than intervals between adjacent wire stoppers among the plurality of wire stoppers.

Each wire guider among the plurality of wire guiders may respectively include a through-hole through which the wire passes.

A size of the through-hole may be smaller than a size of each of the wire stoppers.

A force applied to the wire from the first movement control part may move the wire in a first direction to change the curvature-changing member from the unbent state thereof to a bent state thereof.

The curvature-changing member may further include first to third bending regions defined between adjacent wire guiders among the plurality of wire guiders.

The plurality of wire guiders may include first to fourth wire guiders, and the plurality of wire stoppers may include first to fourth wire stoppers which respectively correspond to the first to fourth wire guiders.

The first bending region may be defined between the first and second wire guiders, the second bending region may be defined between the second and third wire guiders, and the third bending regions may be defined between the third and fourth wire guiders.

The first wire stopper may be disposed in the first bending region, the second wire stopper may be disposed in the second bending region, the third wire stopper may be disposed in the third bending region, and the fourth wire stopper may be disposed outside the third bending region.

Where the force applied to the wire from the first movement control part moves the wire in the first direction to change the curvature-changing member from the unbent state thereof to the bent state thereof, curvatures of the first to third bending regions may be limited by the intervals between adjacent wire stoppers among the first to fourth wire stoppers.

Radii of curvatures of the first to third bending regions limited by the intervals between the first to fourth wire stoppers may be proportional to the intervals between the first to fourth wire stoppers.

The curvature-changing member may further include a plurality of auxiliary wire stoppers which respectively correspond to the first to fourth wire guiders, coupled to the wire at predetermined intervals along the length of the wire, the plurality of auxiliary wire stoppers limiting the movement of the wire along the moving path; and a second movement control part which moves the wire. In the unbent state of the curvature-changing member, intervals between adjacent wire guiders among the first to fourth wire guiders are substantially the same as intervals between adjacent auxiliary wire stoppers.

The size of the through-hole may be smaller than a size of each of the auxiliary wire stoppers.

A force applied to the wire from the second movement control part moves the wire in a second direction opposite to the first direction to change the curvature-changing member from the bent state thereof to the unbent state thereof.

The plurality of auxiliary wire stoppers may include fifth to eighth wire stoppers which respectively correspond to the first to fourth wire guiders.

The first and fifth wire stoppers may face each other with the first wire guider therebetween, the second and sixth wire stoppers may face each other with the second wire guider therebetween, the third and seventh wire stoppers may face each other with the third wire guider therebetween, and the fourth and eighth wire stoppers may face each other with the fourth wire guider therebetween.

In another exemplary embodiment of the invention, a display apparatus includes: a display module including a flexible display panel; a curvature-changing member configured to adjust a curvature of the display module; and a bottom chassis in which is disposed the display module and the curvature-changing member. The curvature-changing member includes a wire; a movement control part which movies the wire; first to fourth wire guiders through which the wire passes, the first to fourth wire guiders disposed at predetermined intervals in a moving path of the wire to guide the moving path of the wire; a curvature maintaining part between the second and third wire guiders, the curvature maintaining part maintaining a gap between the second and third wire guiders in the moving path of the wire; and first and second wire stoppers which are coupled to the wire at predetermined intervals along a length of the wire, the first and second wire stoppers limiting the movement of the wire along the moving path.

The curvature-changing member may further include first and third bending regions respectively defined between the first and second wire guiders and between the third and fourth wire guiders, and a second bending region defined between the second and third wire guiders, the second bending region between the first and third bending regions along the moving path of the wire. A force applied to the wire from the movement control part moves the wire in a first direction to change the curvature-changing member from an unbent state thereof to a bent state thereof. Where the force applied to the wire from the first movement control part moves the wire in the first direction to change the curvature-changing member from the unbent state thereof to the bent state thereof, a curvature of the second bending region is defined by the curvature maintaining part, and a radius of curvature of the first bending region defined between the first and second wire guiders and a radius of curvature of the third bending region defined between the third and fourth wire guiders are limited by intervals between the first and second wire stoppers.

In still another exemplary embodiment of the invention, a display apparatus includes: a display module including a flexible display panel; a curvature-changing member configured to adjust a curvature of the display module; and a bottom chassis in which is disposed the display module and the curvature-changing member. The curvature-changing member includes a wire; a movement control part fixed at a first end of the curvature-changing member, to which opposing ends of the wire are coupled, the movement control part moving the wire in a first direction, and in a second direction opposite to the first direction; a direction switching mechanism fixed at a second end of the curvature-changing member opposite to the first end thereof, the direction switching mechanism configured to allow switching of a moving direction of the wire between the first and second directions; a flexible supporting part fixed at the second end of the curvature-changing member, where an upper portion of the wire is disposed above an upper surface of the supporting part and a lower portion of the wire is disposed below a lower surface of the supporting part; a plurality of wire guiders through which the wire passes, the plurality of wire guiders disposed at predetermined intervals in a moving path of the wire, the plurality of wire guiders disposed on the upper and the lower surfaces of the supporting part to guide the moving path of the wire; a plurality of first wire stoppers which is coupled to the wire at predetermined intervals along a length of the wire disposed above the upper surface of the supporting part, the plurality of first wire stoppers disposed between first wire guiders disposed on the upper surface of the supporting part; and a plurality of second wire stoppers which is coupled to the wire at predetermined intervals along a length of the wire disposed below the lower surface of the supporting part, the plurality of second wire stoppers disposed between second wire guiders disposed on the lower surface of the supporting part. The plurality of first and second wire stoppers limits the movement of the wire along the moving path. In an unbent state of the curvature-changing member, intervals between the first wire stoppers above the upper surface of the supporting part are substantially the same as intervals between the first wire guiders disposed on the upper surface of the supporting part; and intervals between the second wire stoppers disposed below the lower surface of the supporting part are smaller than intervals between the second wire guiders disposed on the lower surface of the supporting part.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION

Figure 1:
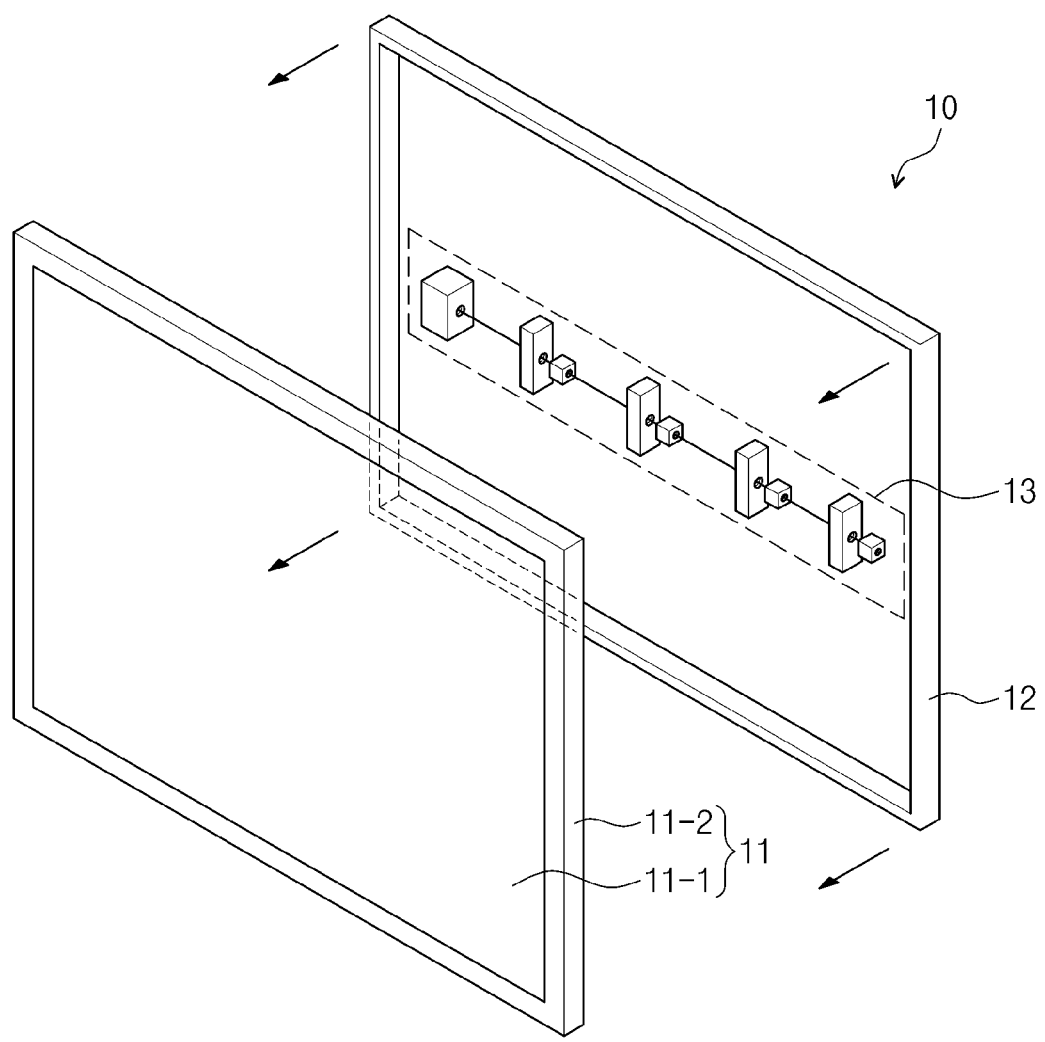
FIG. 1 is an exploded perspective view of an exemplary embodiment of a display apparatus.

The terms used herein are selected from general terms widely used if possible in consideration of the functions herein. However, these may be changed according to the intent of a person of ordinary skill in the art, practice or the advent of new technologies. Also, in specific cases, there may be terms selected by the applicants, in which case, the meaning will be described in the detailed description of the corresponding exemplary embodiment. Thus, the terms used in the specification should not be understood simply as the names thereof, but should be understood based on actual meanings that are not the terms, and the entire contents of the specification.

Furthermore, hereinafter exemplary embodiments of the invention will be described in more detail with reference to the accompanying drawings. However, it is to be understood that the invention is not limited to the exemplary embodiments described below.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described in more detail with reference to the accompanying drawings.

FIG. 1 is an exploded perspective view of an exemplary embodiment of a display apparatus.

Referring to FIG. 1, a display apparatus 10 may include a display module 11 which displays an image and a bottom chassis 12 accommodating the display module 11 therein.

The display module 11 may include a flexible display panel 11-1 which substantially displays the image, and a panel driving part (not shown) which provides various driving signals to the flexible display panel 11-1 which allows the flexible display panel 11-1 to display the image. Also, the display module 11 may include a frame-shaped top chassis 11-2 which surrounds upper and side surfaces of edges of the flexible display panel 11-1.

The flexible display panel 11-1 represents a display panel which is flexible as including or manufactured to include a flexible substrate configured to be bent, folded or rolled without loss of display performance. As an exemplary embodiment, the flexible display panel 11-1 may be an organic light-emitting display panel including an organic light-emitting diode.

The organic light-emitting display panel is a self light-emitting display panel using the principle that electric current flows in a fluorescent or phosphorescent organic thin film and light is generated while electrons and holes are combined at the organic thin film. The organic light-emitting display panel has various merits, such as a bright and clear image quality, relatively wide viewing angle and relatively small power consumption. Particularly, the organic light-emitting display panel may include or be manufactured to include stacked organic thin films, to have a flexible property. However, the invention is not limited to the above-described exemplary embodiment, and various display panels having a flexible property may be used as a flexible display panel 11-1 of the invention.

The bottom chassis 12 may accommodate the display module 11 and/or the flexible display panel 11-1 of the display module 11 therein. Particularly, the bottom chassis 12 may be coupled to the top chassis 11-2 of the display module 11 to form the display apparatus 10. Similar to the flexible display panel 11-1, the bottom chassis 12 may have a flexible property. Also, the bottom chassis 12 may have a thermal expansion coefficient similar to that of the flexible display panel 11-1 so as to reduce or effectively prevent the generation of thermal stress, etc. within such components of the display apparatus 10.

The bottom chassis 12 may include a curvature-changing member 13 configured to adjust a curvature of the display module 11. The curvature-changing member 13 may adjust a curvature of the display module 11 according to a curvature adjustment input. Since the bottom chassis 12 has a flexible property, the curvature of the bottom chassis 12 may also be adjusted according to a change in the curvature of the curvature-changing member 13. As a result, a curvature of the display module 11 accommodated in the bottom chassis 12 may be adjusted.

Accordingly, a curvature, a bending axis, a bending shape, etc., of the display module 11 may be determined by a position of the curvature-changing member 13. In an exemplary embodiment, for example, when the curvature-changing member 13 elongated to extend in a horizontal direction is disposed at a vertical direction center of the bottom chassis 12, the display module 11 may have a shape bent along the horizontal direction. Hereinafter, for convenience of description, description will be given with respect to the curvature-changing member 13 illustrated in FIG. 1 which is elongated to extend in the horizontal direction and is disposed at the vertical direction center of the bottom chassis 12.

The curvature-changing member 13 may adjust the curvature of the display module 11 in various exemplary embodiments, and more detailed description about this will be given below with reference to respective drawings.

Figure 2A:
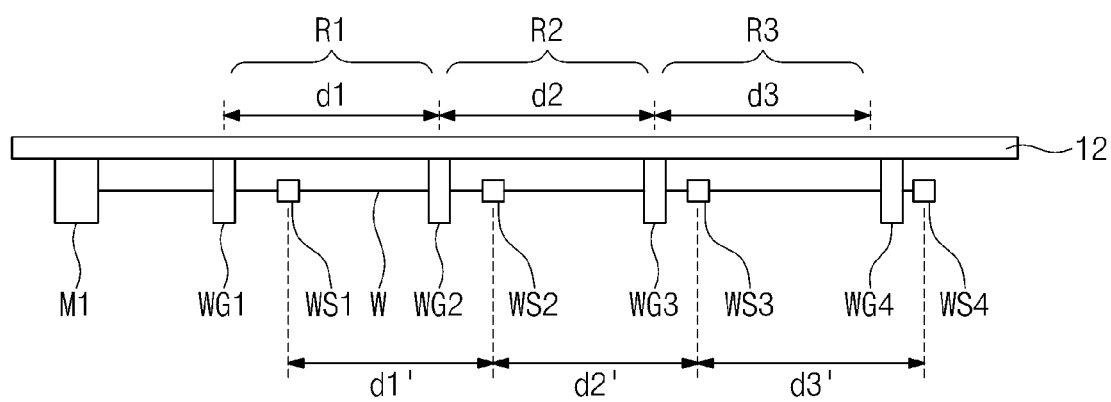
FIG. 2A is a cross-sectional view of an exemplary embodiment of a curvature-changing member in an unbent state thereof.
Figure 2B:
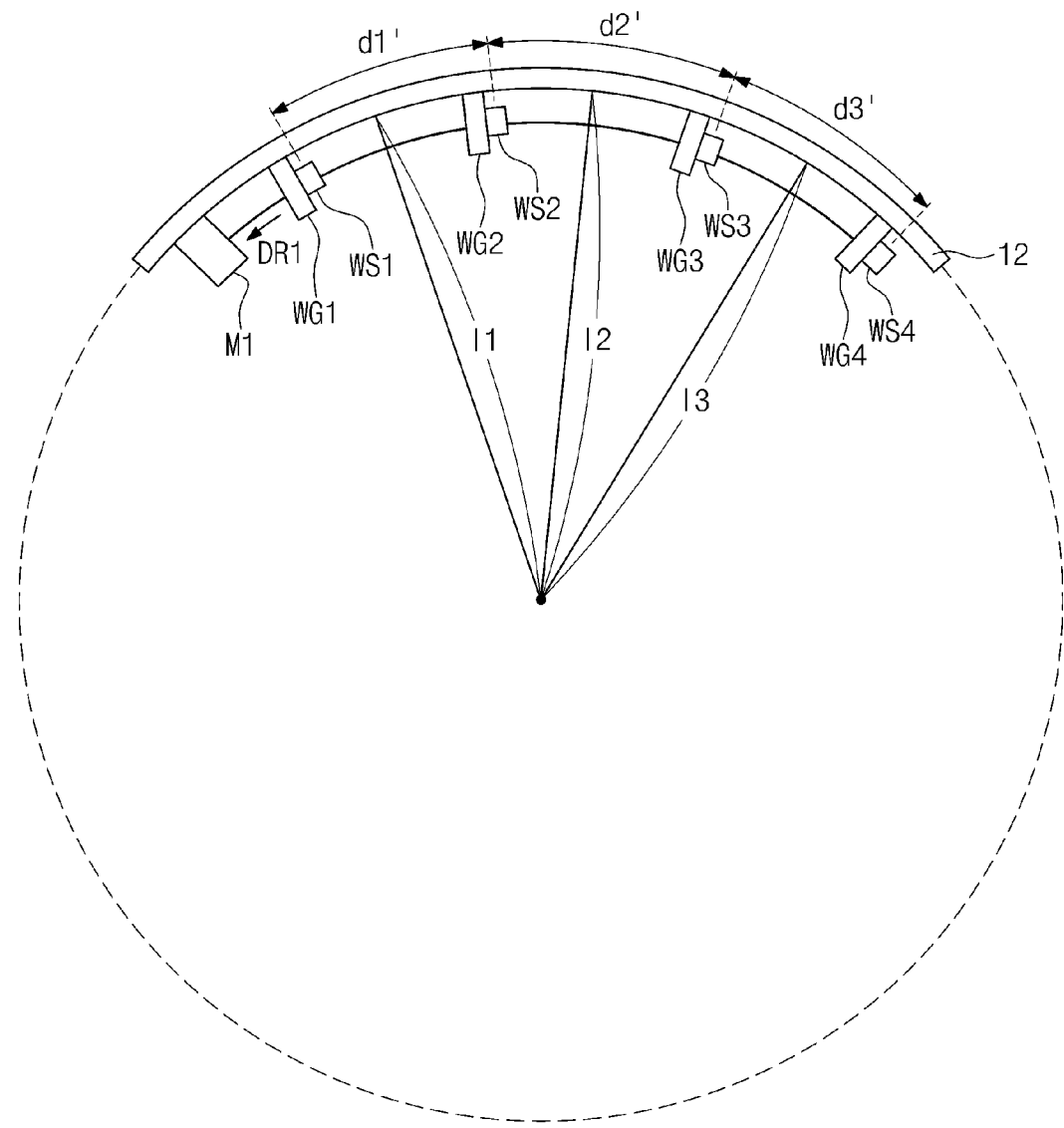
FIG. 2B is a cross-sectional view of the curvature-changing member of FIG. 2A, in a bent state thereof.

FIG. 2A is a cross-sectional view of an exemplary embodiment of a curvature-changing member in an unbent state thereof. FIG. 2B is a cross-sectional view of the curvature-changing member of FIG. 2A in a bent state thereof.

Referring to FIGS. 2A and 2B, the curvature-changing member may include an elongated member such as a wire W, a movement control part M1, a plurality of wire guiders WG1 to WG4, and a plurality of wire stoppers WS1 to WS4.

The wire W may include or be formed of a relative hard or rigid material. In an exemplary embodiment, for example, the wire W may have a rope shape in which several plies or layers of steel wire are twisted together. The wire W has a high tenacity so as to not be easily broken or cut. The wire W has a length in an elongation direction thereof, and a cross-section (or width) in a direction perpendicular to the elongation direction. The cross-section may be in a thickness direction of the display module 11.

The movement control part M1 may be configured to move the wire W or change a relative position of the wire W. The movement control part M1 may move the wire W by using various kinds of energy. In an exemplary embodiment, for example, the movement control part M1 may include a motor to move the wire W by using mechanical energy. To move the wire W by using mechanical energy, the wire W is disposed to be wound or unwound around a rotation shaft of the motor, thereby being moved according to the rotation of the motor. Alternatively, the movement control part M1 may move the wire W by using various kinds of energy such as thermal energy, electrical energy, but the invention is not limited to the above-described exemplary embodiment.

The plurality of wire guiders WG1 to WG4 may be disposed at predetermined intervals on the bottom chassis 12 along the horizontal direction thereof. The plurality of wire guiders WG1 to WG4 may be disposed at predetermined intervals along a moving path of the wire W, and may be configured to guide the moving path of the wire W. Each of the wire guiders WG1 to WG4 may include a through-hole (not shown) defined therein and through which the wire W passes. The wire W may pass through the through-hole of each of the wire guiders WG1 to WG4 to be connected to the movement control part M1. Accordingly, a size or dimension of the through-hole may be larger that that of a maximum cross-section of the wire W. The plurality of wire guiders WG1 to WG4 may include or be formed of a relatively hard material. The wire W passes through the wire guiders WG1 to WG4 and is moved relative to the wire guiders WG1 to WG4 by the movement control unit M1.

The plurality of wire stoppers WS1 to WS4 may be connected to the wire W at predetermined intervals along the elongation direction of the wire W. The position of the plurality of wire stoppers WS1 to WS4 along the wire W may be fixed at the predetermined intervals. The plurality of wire stoppers WS1 to WS4 may limit the motion or fix a position of the wire W relative to other components of the curvature changing member 13. An interval between the wire stoppers WS1 to WS4 may distribute the force applied from the movement control part M1 to control the curvature along the curvature changing member 13. More specifically, each of the wire stoppers WS1 to WS4 has an overall or maximum size larger than that of the through-holes of the wire guiders WG1 to WG4, and therefore may not pass through the through-holes of the wire stoppers WS1 to WS4.

As a result, the movement of the wire stoppers WS1 to WS4 is limited by the wire guiders WG1 to WG4, and the movement of the wire W coupled to the wire stoppers WS1 to WS4 is also limited by the wire guiders WG1 to WG4.

Disposition intervals d1' to d3' between adjacent wire stoppers WS1 to WS4 may be smaller than disposition intervals d1 to d3 between adjacent wire guiders WG1 to WG4. When a force is applied to the wire stoppers WS1 to WS4 having the relatively small disposition intervals d1' to d3' therebetween, the curvature-changing member 13 may be bent. The force applied to the stoppers WS1 to WS4 may be a continuously moving force, such that each of the wire stoppers WS1 to WS4 is applied with the force, such as at substantially the same time. When the curvature-changing member 13 is bent, the disposition intervals d1 to d3 between the wire guiders WG1 to WG4 which limit the movement of the wire stoppers WS1 to WS4 are reduced. In an exemplary embodiment, the disposition intervals d1 to d3 between the wire guiders WG1 to WG4 are reduced to be substantially the same as the disposition intervals d1' to d3' between the wire stoppers WS1 to WS4.

More specifically, although the movement of the wire W is limited since the wire stoppers WS1 to WS4 may not pass through the through-holes of the wire guiders WG1 to WG4, the movement control part M1 may continuously apply force for moving the wire W to which the wire stoppers WS1 to WS4 are coupled. Due to the moving force of the wire stoppers WS1 to WS4 coupled to the wire W, a predetermined force may be applied to the wire guiders WG1 to WG4 which interrupt the movement of the wire stoppers WS1 to WS4. The wire stoppers WS1 to WS4 may apply the predetermined force to the wire guiders WG1 to WG4 in a direction along which the disposition intervals d1 to d3 between the wire guiders WG1 to WG4 are reduced to be substantially the same as the disposition intervals d1' to d3' between the wire stoppers WS1 to WS4. As a result, the wire W and the bottom chassis 12 to which the wire guiders WG1 to WG4 are disposed or fixed are each disposed in bent states thereof, so that the curvature-changing member 13 may be disposed in the bent state thereof. As the curvature-changing member 13 is bent, the display module 11 may be disposed in a bent state thereof.

As an exemplary embodiment, the curvature-changing member 13 may include first to fourth wire guiders WG1 to WG4 as the plurality of wire guiders, and may include first to fourth wire stoppers WS1 to WS4 as the plurality of wire stoppers. The first to fourth wire guiders WG1 to WG4 may respectively correspond to the first to fourth wire stoppers WS1 to WS4. The intervals d1' to d3' between the wire stoppers WS1 to WS4 may be smaller than the intervals d1 to d3 between the wire guiders WG1 to WG4.

The curvature-changing member 13 may be subdivided into first to third bending regions R1 to R3 by the first to fourth wire guiders WG1 to WG4. The first bending region R1 may be defined by the first and second wire guiders WG1 and WG2, the second bending region R2 may be defined by the second and third wire guiders WG2 and WG3, and the third bending regions R3 may be defined by the third and fourth wire guiders WG3 and WG4. In an exemplary embodiment, for example, the first bending region R1 may be a region between the first and second wire guiders WG1 and WG2, the second bending region R2 may be a region between the second and third wire guiders WG2 and WG3, and the third bending region R3 may be a region between the third and fourth wire guiders WG3 and WG4.

The wire W may be extended in the elongation direction thereof to pass through the first to fourth wire guiders WG1 to WG4. A first end of the wire W may be connected to the fourth wire stopper WS4 at a first end of the curvature-changing member 13, and a second end of the wire W opposing the first end thereof may be connected to the first movement control part M1 disposed at an outer side of the first wire guider WG1 at the second end of the curvature-changing member 13 opposite to the first end thereof. The first wire stopper WS1 may be disposed in the first bending region R1, the second wire stopper WS2 may be disposed in the second bending region R2, the third wire stopper WS3 may be disposed in the third bending region R3, and the fourth wire stopper WS4 may be disposed outside the third bending region R3.

The first movement control part M1 may be used to move the wire W in a first direction DR1. The first to fourth wire stoppers WS1 to WS4 connected to the wire W may also move together with each other in a first direction DR1. The movement of the wire W may be limited by the first to fourth wire stoppers WS1 to WS4 which are unable to pass through the first to fourth wire guiders WG1 to WG4. Here, the first movement control part M1 may continuously apply the force which moves the wire W in the direction DR1, and the first to fourth wire stoppers WS1 to WS4 connected to the wire W in turn apply the predetermined force to the first to fourth wire guiders WG1 to WG4 positioned in the first direction DR1 to thereby bend the curvature-changing member 13 which includes the first to fourth wire guiders WG1 to WG4. As a result, the disposition intervals d1 to d3 between the first to fourth wire guiders WG1 to WG4 may be reduced to be substantially the same as the disposition intervals d1' to d3' between the first to fourth wire stoppers WS1 to WS4. As the curvature-changing member 13 is bent, the display module 11 may be bent to be disposed in a bent state thereof.

Curvatures of the first to third bending regions R1 to R3 may be determined corresponding to the disposition intervals d1' to d3' between the first to fourth wire stoppers WS1 to WS4. More specifically, the first to third bending regions R1 to R3 may be bent so as to have radii of curvature I1 to I3 within a profile of a circle which has, as an arc thereof, the disposition intervals d1' to d3' between the first to fourth wire stoppers WS1 to WS4 along the first direction DR1. Accordingly, the radii of curvature I1 to I3 of the first to third bending regions R1 to R3 may be proportional to the disposition intervals d1' to d3' between the first to fourth wire stoppers WS1 to WS4. A maximum radii of curvature of the first to third bending regions R1 to R3 may be limited or defined by the disposition intervals d1' to d3' between the first to fourth wire stoppers WS1 to WS4.

In an exemplary embodiment, for example, as the disposition intervals d1' to d3' between the first to fourth wire stoppers WS1 to WS4 become larger, the radii of curvature I1 to I3 of the first to third bending regions R1 to R3 respectively become larger. Conversely, as the disposition intervals d1' to d3' between the first to fourth wire stoppers WS1 to WS4 become smaller, the radii of curvature I1 to I3 of the first to third bending regions R1 to R3 respectively become smaller.

According to the above descriptions, when designing the radii of curvature I1 to I3 for the bending regions of the display module 11, the disposition intervals d1' to d3' between the first to fourth wire stoppers WS1 to WS4 may be considered. By adjusting the disposition intervals d1' to d3' between the first to fourth wire stoppers WS1 to WS4, the radii of curvature I1 to I3 for the bending regions of the display module 11 may be determined. In an exemplary embodiment, the maximum radii of curvature I1 to I3 for the bending regions of the display module 11 may be determined or defined by the disposition intervals d1' to d3' between the first to fourth wire stoppers WS1 to WS4.

Figure 3A:
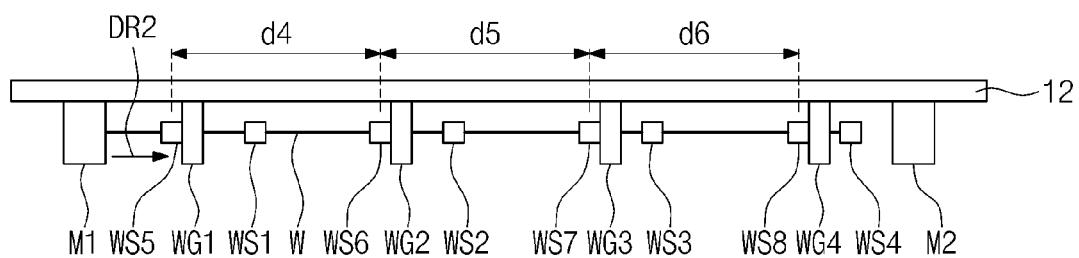
FIG. 3A is a cross-sectional view of an exemplary embodiment of a curvature-changing member which further includes auxiliary wire stoppers, in an unbent state thereof.
Figure 3B:
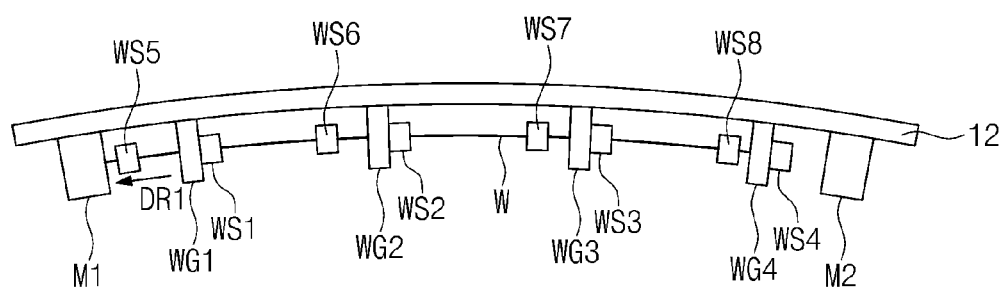
FIG. 3B is a cross-sectional view of the curvature-changing member which further includes the auxiliary wire stoppers of FIG. 3A, in a bent state thereof.
Figure 3C:
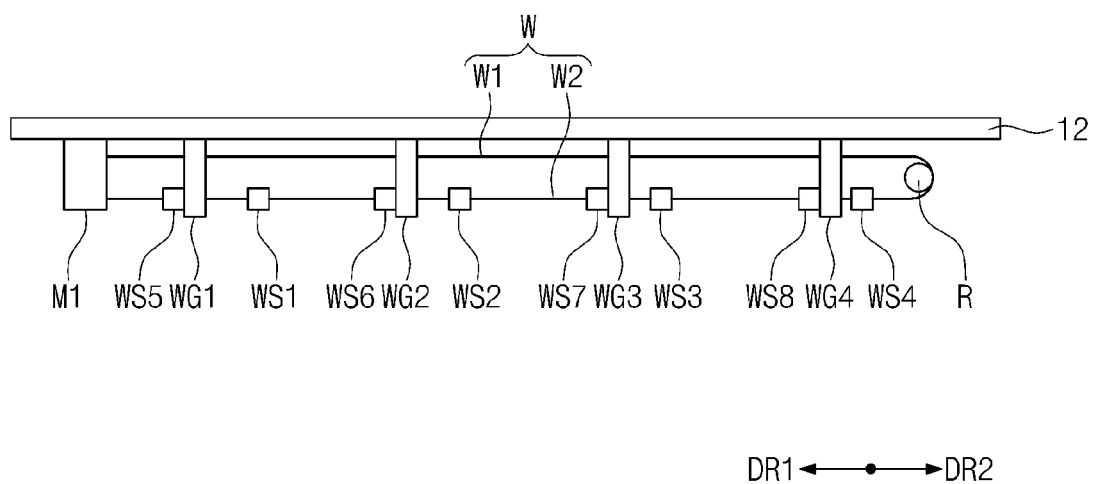
FIG. 3C is a cross-sectional view of a modified exemplary embodiment of the unbent curvature-changing member of FIGS. 3A and 3B which further includes a direction switching mechanism, in an unbent state thereof.

FIG. 3A is a cross-sectional view of an exemplary embodiment of a curvature-changing member which further includes auxiliary wire stoppers, in an unbent state thereof. FIG. 3B is a cross-sectional view of the bent curvature-changing member which further includes the auxiliary wire stoppers of FIG. 3A, in a bent state thereof. FIG. 3C is a cross-sectional view of a modified exemplary embodiment of the unbent curvature-changing member of FIGS. 3A and 3B, which further includes a direction switching mechanism, in an unbent state thereof. Hereinafter, like reference numerals denote like elements in FIGS. 2A and 2B, and the above detailed descriptions given with reference to FIGS. 2A and 2B may also be applied to FIGS. 3A to 3C.

Referring to FIGS. 3A and 3B, the curvature-changing member may further include auxiliary wire stoppers WS5 to WS8 and a second movement control part M2.

The auxiliary wire stoppers WS5 to WS8 may be coupled to the wire W at predetermined intervals along the elongation direction of the wire W in order to unbend the curvature-changing member. Similar to the wire stoppers WS1 to WS4, the auxiliary wire stoppers WS5 to WS8 also perform a function of limiting the motion or fixing a position of the wire W relative to other components of the curvature changing member. The auxiliary wire stoppers WS5 to WS8 may be used in unbending the curvature-changing member by using a force which moves the wire W. Accordingly, the overall or maximum size of each of the auxiliary wire stoppers WS5 to WS8 may be larger than that of the through-hole of each of the wire guiders WG1 to WG4. Disposition intervals between the auxiliary wire stoppers WS5 to WS8 may be substantially the same as the disposition intervals d1 to d3 between the wire guiders WG1 to WG4, and the auxiliary wire stoppers WS5 to WS8 may respectively correspond to the wire guiders WG1 to WG4.

The second movement control part M2 also provides a force which moves the wire W, similar to the first movement control unit M1 which provide a force to the wire W. The second movement control part M2 is disposed to face the first movement control unit M1 along a length direction of the curvature-changing member, and functions to move the wire W in a second direction DR2 opposite to the first direction DR1.

As an exemplary embodiment, the curvature-changing member may further include fifth to eighth wire stoppers WS5 to WS8 as auxiliary wire stoppers. The fifth wire stopper WS5 may be disposed outside the first bending region R1, the sixth wire stopper WS6 may be disposed in the first bending region R1, the seventh wire stopper WS7 may be disposed in the second bending region R2, and the eighth wire stopper WS8 may be disposed in the third bending region R3, respectively. The fifth to eighth wire stoppers WS5 to WS8 may respectively correspond to the first to fourth wire guiders WG1 to WG4.

The fifth wire stopper WS5 may be disposed to face the first wire stopper WS1 with the first wire guider WG1 disposed therebetween, the sixth wire stopper WS6 may be disposed to face the second wire stopper WS2 with the second wire guider WG2 disposed therebetween, the seventh wire stopper WS7 may be disposed to face the third wire stopper WS3 with the third wire guider WG3 disposed therebetween, and the eighth wire stopper WS8 may be disposed to face the fourth wire stopper WS4 with the first wire guider WG4 disposed therebetween.

As described above in detail, when the wire W moves in the first direction DR1 by the first movement control part M1, the curvature-changing member may be bent to reduce disposition intervals d1 to d3 between the wire guiders WG1 to WG4 to be substantially the same as the disposition intervals d1' to d3' between the wire stoppers WS1 to WS4.

When the wire W is moved by the second movement control part M2 in the second direction DR2 opposite to the first direction DR1, movements of the fifth to eighth wire stoppers WS5 to WS8 coupled to the wire W are limited by the first to fourth wire guiders WG1 to WG4 which are disposed in the second direction DR2 relative thereto.

Here, the second movement control part M2 may apply the force which moves the wire W in the second direction DR2, and the fifth to eighth wire stoppers WS5 to WS8 coupled to the wire W in turn may apply the predetermined force to the first to fourth wire guiders WG1 to WG4 positioned in the second direction DR2 relative thereto to unbend the bottom chassis 12 which includes the first to fourth wire guiders WG1 to WG4.

As a result, as the bottom chassis 12 translates from a bent state to an unbent state thereof, the disposition intervals d1 to d3 between the wire guiders WG1 to WG4, which were substantially the same as the disposition intervals d1' to d3' between the wire stoppers WS1 to WS4, may increase to disposition intervals d4 to d6 between the fifth to eighth wire stoppers WS5 to WS8. The disposition intervals d1 to d3 between the first to fourth wire guiders WG1 to WG4 may be substantially the same as the disposition intervals d4 to d6 between the fifth to eighth wire stoppers WS5 to WS8. As the curvature-changing member is unbent, the display module 11 may be disposed in an unbent state thereof.

When the bent state of the curvature-changing member under the force from the first movement control part M1 continues for a relatively long time, the bent state of the curvature-changing member may be maintained by the shape deformation of the bottom chassis 12, even when the force from the first movement control part M1 is removed or not applied. In the exemplary embodiment related to FIGS. 3A and 3B, the auxiliary wire stoppers WS5 to WS8 for securing the unbent state of the curvature-changing member are further included, thereby allowing a user to accurately control the bending of the display module 11.

The curvature-changing member may include various numbers of wire stoppers and wire guiders for adjusting the curvature of the display module 11 by using a force which moves the wire W, such as the wire stoppers and wire guiders being in one-to-correspondence, but the invention concept is not limited to the above described exemplary embodiment. In an exemplary embodiment, for example, in addition to the above described exemplary embodiments, the curvature-changing member may include the first to fourth wire guiders WG1 to WG4 as a plurality of wire guiders, and include the first and second wire stoppers WS1 and WS2 as a plurality of wire stoppers. The first and second wire stoppers WS1 and WS2 may be coupled to the wire W at position corresponding to any two wire guiders among the first to fourth wire guiders WG1 to WG4.

Referring to FIG. 3C, the curvature-changing member may include a direction switching mechanism R instead of the second movement control part M2 of FIG. 3B.

The direction switching mechanism R performs a function of switching the direction of the force applied to move a wire W. Although the first movement control part M1 moves the wire W in the first direction DR1, the wire W may move in the first and second directions DR1 and DR2 in each bending region by the direction switching mechanism R. Accordingly, in the exemplary embodiment illustrated in FIG. 3C, the second movement control part M2 (refer to FIGS. 3A and 3B) for moving the wire W in the second direction DR2 may be not provided.

Both of opposing other ends of the continuous single wire W may be in connection with the first movement control part M1. Each of the wire guiders WG1 to WG4 may include two through-holes defined therein. More specifically, each of the wire guiders WG1 to WG4 may include first through-holes, through which a first wire portion W1 extending from the first movement control part M1 in the second direction DR2 may pass, and second through-holes, through which a second wire portion W2 extending from the direction switching mechanism R in the first direction DR1, may pass. The first to eighth wire stoppers WS1 to WS8 may be coupled to the wire portion which extends in the first or second direction DR1 or DR2. FIG. 3C illustrates the curvature-changing member, in which the first to eighth wire stoppers WS1 to WS8 are coupled to the second wire portion W2 which extends in the first direction DR1.

The first movement control part M1 selectively pulls one of the opposing ends of wire W connected thereto, so that the wire W including the first to eighth wire stoppers WS1 to WS8 connected thereto may be moved in the first and second directions DR1 and DR2. Referring to the description above with reference to FIGS. 3A and 3B, as the second wire portion W2 including the first to eighth wire stoppers WS1 to WS8 connected thereto moves in the first direction DR1, the curvature-changing member may be bent. Conversely, as the second wire portion W2 moves in the second direction DR2, the curvature-changing member may be unbent.

The direction switching mechanism R may be actuated such as rotating according to the movement of the wire W. The direction switching mechanism R may be included in the curvature-changing member as various forms which allow the moving direction of the wire W to be switched, but the invention is not limited to the above described exemplary embodiment. The direction switching mechanism R may be disposed outside the third bending region R3, and disposed to face the first movement control part M1.

Figure 4A:
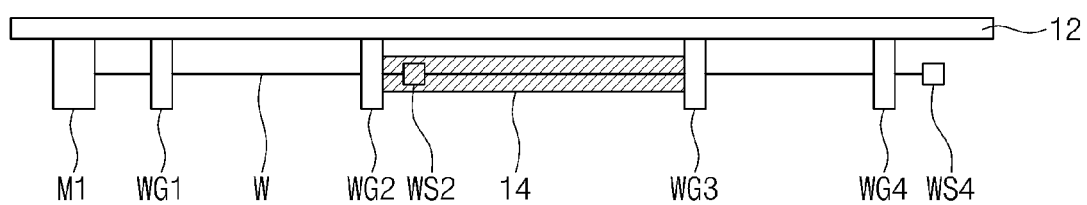
FIG. 4A is a cross-sectional view of an exemplary embodiment of a curvature-changing member including a curvature maintaining part, in an unbent state thereof.
Figure 4B:
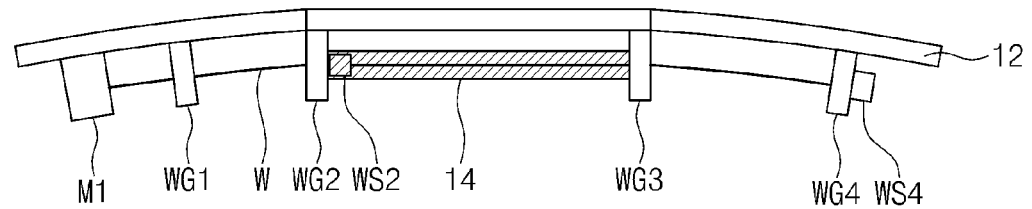
FIG. 4B is a cross-sectional view of the curvature-changing member including the curvature maintaining part of FIG. 4A, in a bent state thereof.

FIG. 4A is a cross-sectional view of an exemplary embodiment of a curvature-changing member including a curvature maintaining part, in an unbent state thereof. FIG. 4B is a cross-sectional view of the bent curvature-changing member including a curvature maintaining part of FIG. 4A, in a bent state thereof. Hereinafter, like reference numerals denote like elements in FIGS. 2A to 3C, and the above detailed descriptions given reference to FIGS. 2A to 3C may also be applied to FIGS. 4A and 4B.

Referring to FIGS. 4A and 4B, the curvature-changing member may include a curvature maintaining part 14 for maintaining a curvature of a specific bending region.

The curvature maintaining part 14 may be disposed between the wire guiders WG2 and WG3 which define the specific bending region R2 to maintain a curvature of the specific bending region R2. That is, the curvature maintaining part 14 may limit or define a maximum curvature of the bending region R2. The curvature maintaining part 14 maintain the disposition interval d2 between the wire guiders WG2 and WG3, so that the curvature of the specific bending region R2 may be maintained regardless of the movement of the wire W and a curvature of remaining portions of the curvature-changing member. For this, the width of the curvature maintaining part 14 may be substantially the same as the disposition interval d2 between the wire guiders WG2 and WG3.

In an exemplary embodiment, for example, the curvature-changing member may include the curvature maintaining part 14 which has substantially the same width as the disposition interval d2 between the second and third wire guiders WG2 and WG3 in the second bending region R2. The curvature maintaining part 14 may maintain the disposition interval d2 between the second and third wire guiders WG2 and WG3 to be constant, so that the curvature of the second bending region R2 may be maintained constant regardless of the movement of the wire W and a curvature of remaining portions of the curvature-changing member.

While the radii of curvature I1 and I3 of the first and third bending regions R1 and R3 are reduced by the force by which the first movement control part M1 moves the wire W, the radius of curvature I2 of the second bending region R2 may be maintained constant. The curvature maintaining part 14 may have a cylindrical structure through which the wire W passing through the second and third wire guiders WG2 and WG3 passes.

In the exemplary embodiment illustrated in FIGS. 4A and 4B, the curvature maintaining part 14 may cooperate with two wire stoppers WS2 and WS4 of the curvature-changing member. More specifically, the curvature-changing member may include the second and fourth wire stoppers WS2 and WS4 which respectively correspond to the second and fourth wire guiders WG2 and WG4 of the curvature-changing member. The second wire stopper WS2 may be disposed in the second bending region R2, and the fourth wire stopper WS4 may be disposed outside the third bending region R3. The second and fourth wire stoppers WS2 and WS4 may cause the curvature-changing member to bend by limiting the movement of the wire W in the first direction DR1. In addition, the curvature-changing member may include first and third wire stoppers WS1 and WS3 respectively corresponding to the first and third wire guiders WG1 and WG3 as the plurality of wire stoppers, but the invention is not limited to the above described embodiment.

Along the horizontal direction of the display apparatus 10, the second bending region R2 at a centermost position may be considered as a front direction bending region R2. When considering above-mentioned points, the curvature-changing member of the exemplary embodiment in FIGS. 4A and 4B has an effect in that while the radius of curvature of the front direction bending region R2 is maintained constant, the radii of curvature I1 and I3 of the bending regions R1 and R3 at opposing sides of the front direction bending region R2 may be selectively adjusted relative to the front direction bending region R2.

Figure 5A:
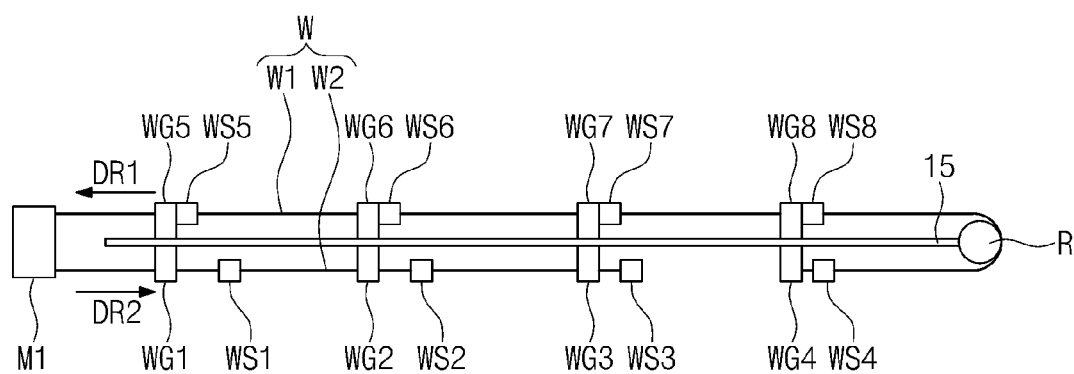
FIG. 5A is a cross-sectional view of another exemplary embodiment of a curvature-changing member, in an unbent state thereof.
Figure 5B:
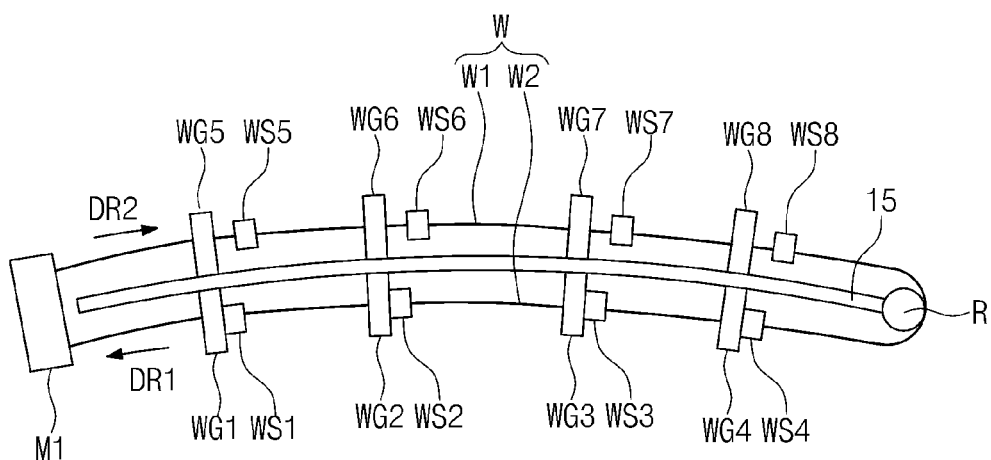
FIG. 5B is a cross-sectional view of the curvature-changing member of FIG. 5A in a bent state thereof.

FIG. 5A is a cross-sectional view of another exemplary embodiment of a curvature-changing member, in an unbent state thereof. FIG. 5B is a cross-sectional view of the curvature-changing member of FIG. 5A, in a bent state thereof. Hereinafter, like reference numerals denote like elements in FIGS. 2A to 4B, and the above detailed descriptions given with reference to FIGS. 2A to 4B may also be applied to FIGS. 5A and 5B.

Referring to FIGS. 5A and 5B, the curvature-changing member may include a supporting part 15, a wire W moving over and under the supporting part 15 in the cross-sectional direction, a movement control part M1, a direction switching mechanism R, a plurality of wire guiders WG1 to WG8, and a plurality of wire stoppers WS1 to WS8.

The curvature-changing member of the exemplary embodiment in FIGS. 5A and 5B may further include the supporting part 15. At a second end of the supporting part 15, the movement control part M1 moving the wire W may be disposed, and at a first end of the supporting part 15 opposite to the second end, the direction switching mechanism R may be disposed. The supporting part 15 may be fixed to the direction switching mechanism R, but the invention is not limited thereto. Portions W1 and W2 of the wire W may move in directions opposite to each other and be respectively disposed above and below the supporting part 15 in the cross-sectional direction by the direction switching mechanism R.

Below the supporting part 15, the first to fourth wire guiders WG1 to WG4 for bending the curvature-changing member may be disposed at predetermined intervals. Above the supporting part 15, the fifth to eighth wire guiders WG5 to WG8 for unbending the curvature-changing member may be disposed at predetermined intervals. The first and fifth wire guiders WG1 and WG5, the second and sixth wire guiders WG2 and WG6, the third and seventh wire guiders WG3 and WG7, and the fourth and eighth wire guiders WG4 and WG8 may be disposed on the supporting part 15 in one-to-one correspondence in a vertical direction, respectively. The first to eighth wire guiders WG1 to WG8 may be fixed to the supporting part 15 at respective upper and lower sides thereof, but the invention is not limited thereto. In an exemplary embodiment, the first and fifth wire guiders WG1 and WG5, the second and sixth wire guiders WG2 and WG6, the third and seventh wire guiders WG3 and WG7, and the fourth and eighth wire guiders WG4 and WG8 may respectively define four individual wire guiders WG through which the supporting part 15 extends.

Corresponding to the first and fourth wire guiders WG1 and WG4, the first and fourth wire stoppers WS1 and WS4 may be respectively coupled to the lower wire portion W2 which passes through the first and fourth wire guiders WG1 and WG4. Corresponding to the fifth and eighth wire guiders WG5 and WG8, the fifth and eighth wire stoppers WS5 and WS8 may be respectively coupled to the upper wire portion W1 which passes through the fifth and eighth wire guiders WG5 and WG8.

The disposition intervals between the first to fourth wire stoppers WS1 to WS4 may be smaller than the disposition intervals between the first to fourth wire guiders WG1 to WG4. Also, the disposition intervals between the fifth to eighth wire stoppers WS5 to WS8 may be substantially the same as the disposition intervals between the fifth to eighth wire guiders WG5 to WG8. Accordingly, the first to fourth wire stoppers WS1 to WS4 may perform the function of bending the curvature-changing member, and the fifth to eighth wire stoppers WS5 to WS8 may perform the function of unbending the curvature-changing member.

Referring to FIG. 5A, when the movement control part M1 moves the upper wire portion W1 in the first direction DR1, and moves the lower wire portion W2 in the second direction DR2, the curvature-changing member may be unbent by the fifth to eighth wire stoppers WS5 to WS8 which may not pass through the fifth to eighth wire guiders WG5 to WG8. Conversely, referring to FIG. 5A, when the movement control part M1 moves the upper wire portion W1 in the second direction DR2, and moves the lower wire portion W2 in the first direction DR1, the curvature-changing member may be concavely bent in a direction towards a front surface of the display module 11 by the first to fourth wire stoppers WS1 to WS4, which are unable to pass through the first to fourth wire guiders WG1 to WG4.

Also, although not illustrated in FIGS. 5A and 5B, for bending in an opposite direction (e.g., convexly bent in a direction away from the front surface of the display module 11), disposition intervals between the fifth to eighth wire stoppers WS5 to WS8 may be formed to be smaller than disposition intervals between the fifth to eighth wire guiders WG5 to WG8. Also, disposition intervals between the first to fourth wire stoppers WS1 to WS4 may be substantially the same as the disposition intervals between the first to fourth wire guiders WG1 to WG4. As a result, opposite to that illustrated in FIGS. 5A and 5B, when the movement control part M1 moves the upper wire portion W1 in the first direction DR1, and moves the lower wire portion W2 in the second direction DR2, the curvature-changing member may be convexly bent in a direction toward the front surface of the display module 11 by the fifth to eighth wire stoppers WS5 to WS8 which are unable to pass through the fifth to eighth wire guiders WG5 to WG8.

Figure 6A:
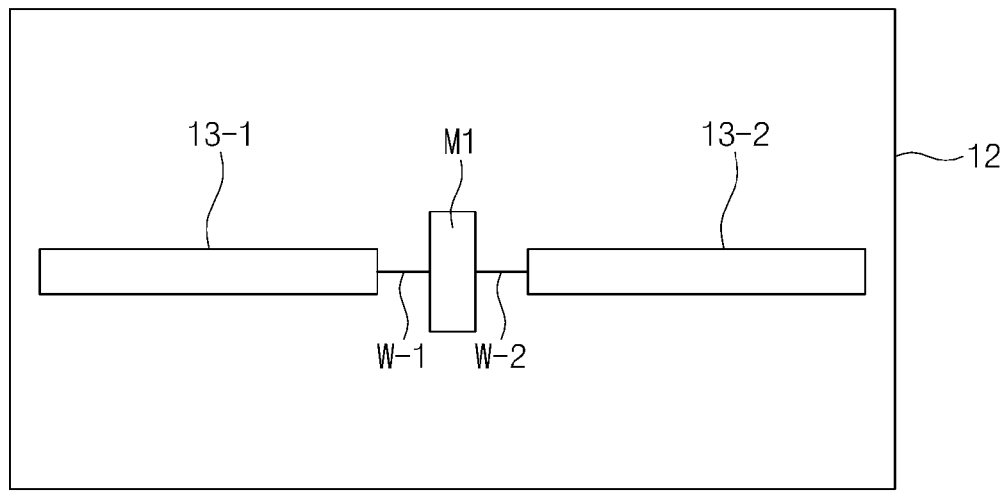
FIGS. 6A to 6C are front views of exemplary embodiments of a bottom chassis including a plurality of curvature-changing members.
Figure 6B:
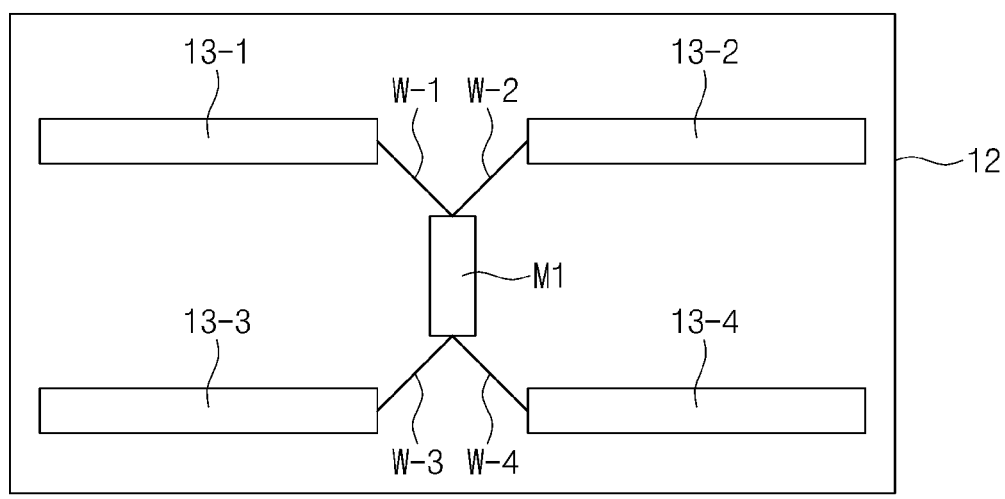
Figure 6C:
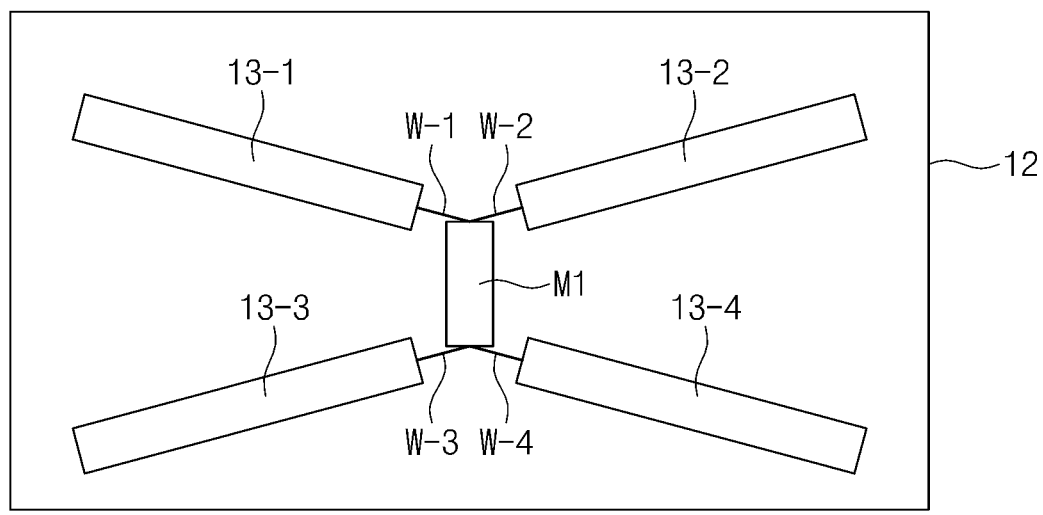

FIGS. 6A to 6C are front views of exemplary embodiments of a bottom chassis including a plurality of curvature-changing members.

Referring to FIG. 6A, the display apparatus 10 may include two curvature-changing members 13-1 and 13-2. The two curvature-changing members 13-1 and 13-2 may be disposed at a vertical direction center of the bottom chassis 12 to be elongated horizontally in parallel to the horizontal direction. Also, each of the curvature-changing members 13-1 and 13-2 may share one movement control part M1. The shared movement control part M1 may control a curvature by generating a force by which the movement control part M1 moves each of the wires W-1 and W-2 of the curvature-changing members.

In the exemplary embodiment of FIG. 6A, the curvature-changing members 13-1 and 13-2 are each elongated to be disposed horizontally in parallel with the horizontal direction of the display apparatus 10, so that the display module 11 may be bent along a horizontal direction of the display apparatus 10. Although not illustrated in FIG. 6A, when the curvature-changing members 13-1 and 13-2 are disposed at the horizontal direction center of the bottom chassis 12 to be elongated vertically in parallel to the vertical direction, the display module 11 may be bent along a vertical direction of the display apparatus 10.

Referring to FIG. 6B, the display apparatus 10 may include four curvature-changing members 13-1 to 13-4. Two curvature-changing members 13-1 to 13-2 among those four curvature-changing members 13-1 to 13-4 may be disposed at an upper (vertical) side of the bottom chassis 12 and elongated horizontally in parallel with the horizontal direction. The remaining two curvature-changing members 13-3 to 13-4 among those four curvature-changing members 13-1 to 13-4 may be disposed at a lower (vertical) side of the bottom chassis 12 and elongated horizontally in parallel with the horizontal direction.

In the exemplary embodiment of FIG. 6B, the four curvature-changing members 13-1 to 13-4 may also share the one movement control part M1. A curvature may be controlled by the force by which the shared movement control part M1 moves each of the wires W-1 to W-4 of the four curvature-changing members 13-1 to 13-4. In the exemplary embodiment of FIG. 6B, the curvature-changing members 13-1 to 13-4 are respectively disposed to be elongated horizontally in parallel with the horizontal direction at upper and lower sides of a horizontal center of the bottom chassis 12, so that the display module 11 may be bent along a horizontal direction of the display apparatus 10.

In a front planar view of the display apparatus 10, the display module 11 may include display area at which an image is displayed and a non-display region at a periphery of the display area and at which an image is not displayed. A front planar view width of the periphery around the display area may be referred to as a bezel. A part of the top chassis 11-2 surrounding an exposed portion of the flexible display panel 11-1 may also be referred to as a bezel of the display apparatus 10. Referring to the exemplary embodiment in FIG. 6B, each of the four curvature-changing members 13-3 to 13-4 may be disposed in a bezel region of the display module 11 and/or a bezel region of the display apparatus 10. As a result, an overall thickness of the display apparatus 10 may be reduced.

Referring to FIG. 6C, the display apparatus 10 may also include four curvature-changing members 13-1 to 13-4 similar to the exemplary embodiment of FIG. 6B. However, unlike the exemplary embodiment of FIG. 6B, the curvature-changing members 13-1 to 13-4 of FIG. 6C may be disposed in an X-shape on the bottom chassis 12. That is, each of the curvature-changing members 13-1 to 13-4 is inclined with respect to the horizontal direction. Accordingly, in the exemplary embodiment in FIG. 6C, when the curvature-changing members 13-1 to 13-4 are bent, the display module 11 may be bent in both the vertical and horizontal directions at a same time, such that the front (viewing surface) of the display apparatus 10 has a profile along a spherical shape.

In the above-described exemplary embodiments, a curvature-changing member may be disposed on the bottom chassis 12 in various shapes and configurations to form various bent shapes of the display apparatus 10, but the invention is not limited to the above described exemplary embodiments.

According to one or more exemplary embodiment, the curvature of a flexible display apparatus may be selectively adjusted to satisfy the preference of a viewer using the flexible display apparatus. Additionally, a manufacturing cost of the flexible display apparatus including the curvature changing member may be relatively low because minimum number of mechanical parts is used.

Although each drawing is individually described for convenience of description, it is possible to combine one or more features of the exemplary embodiments described in each drawing and design, and implement a new exemplary embodiment. Also, the flexible display apparatus including the curvature changing member may not be limited to the configuration and methods of the exemplary embodiments as mentioned above, but the above-mentioned exemplary embodiments may also be configured such that all or a part of each exemplary embodiment may be selectively combined and various modifications could thus be achieved.

Furthermore, although exemplary embodiments are illustrated and described above, the specification is not limited to a specific exemplary embodiment mentioned above. Various modifications are possible by those skilled in the art without departing from the spirit and scope of the claims. Also, such modifications should not be understood separately from the spirit and scope of the inventions.

What is claimed is:
1. A display apparatus, comprising:
a display module comprising a flexible display panel;
a curvature-changing member configured to adjust a curvature of the display module; and
a bottom chassis in which is disposed the display module and the curvature-changing member,
wherein the curvature-changing member comprises:
a wire;
a first movement control part which moves the wire;
a plurality of wire guiders through which the wire passes, the plurality of wire guiders disposed at predetermined intervals in a moving path of the wire to guide the moving path of the wire; and
a plurality of wire stoppers which is coupled to the wire at predetermined intervals along a length of the wire, the plurality of wire stoppers limiting the movement of the wire along the moving path, wherein in an unbent state of the curvature-changing member, intervals between adjacent wire guiders among the plurality of wire guiders are larger than intervals between adjacent wire stoppers among the plurality of wire stoppers.

2. The display apparatus of claim 1, wherein each wire guider among the plurality of wire guiders comprises a through-hole through which the wire passes.

3. The display apparatus of claim 2, wherein a size of the through-hole is smaller than a size of each of the plurality of wire stoppers.

4. The display apparatus of claim 3, wherein a force applied to the wire from the first movement control part moves the wire in a first direction to change the curvature-changing member from the unbent state thereof to a bent state thereof.

5. The display apparatus of claim 4, wherein the curvature-changing member further comprises first to third bending regions defined between adjacent wire guiders among the plurality of wire guiders.

6. The display apparatus of claim 5, wherein
the plurality of wire guiders comprises first to fourth wire guiders, and
the plurality of wire stoppers comprises first to fourth wire stoppers which respectively correspond to the first to fourth wire guiders.

7. The display apparatus of claim 6, wherein
the first bending region is defined between the first and second wire guiders;
the second bending region is defined between the second and third wire guiders; and
the third bending region is defined between the third and fourth wire guiders.

8. The display apparatus of claim 7, wherein
the first wire stopper is disposed in the first bending region;
the second wire stopper is disposed in the second bending region;
the third wire stopper is disposed in the third bending region; and
the fourth wire stopper is disposed outside the third bending region.

9. The display apparatus of claim 8, wherein where the force applied to the wire from the first movement control part moves the wire in the first direction to change the curvature-changing member from the unbent state thereof to the bent state thereof, curvatures of the first to third bending regions are limited by the intervals between adjacent wire stoppers among the first to fourth wire stoppers.

10. The display apparatus of claim 9, wherein radii of curvatures of the first to third bending regions limited by the intervals between the first to fourth wire stoppers are proportional to the intervals between the first to fourth wire stoppers.

11. The display apparatus of claim 6, wherein the curvature-changing member further comprises:
a plurality of auxiliary wire stoppers which respectively correspond to the first to fourth wire guiders, coupled to the wire at predetermined intervals along the length of the wire, the plurality of auxiliary wire stoppers limiting the movement of the wire along the moving path; and
a second movement control part which moves the wire, wherein in the unbent state of the curvature-changing member, intervals between adjacent wire guiders among the first to fourth wire guiders are substantially the same as intervals between adjacent auxiliary wire stoppers.

12. The display apparatus of claim 11, wherein the size of the through-hole is smaller than a size of each of the plurality of auxiliary wire stoppers.

13. The display apparatus of claim 12, wherein a force applied to the wire from the second movement control part moves the wire in a second direction opposite to the first direction to change the curvature-changing member from the bent state thereof to the unbent state thereof.

14. The display apparatus of claim 13, wherein the plurality of auxiliary wire stoppers comprise fifth to eighth wire stoppers which respectively correspond to the first to fourth wire guiders.

15. The display apparatus of claim 14, wherein
the first and fifth wire stoppers face each other with the first wire guider therebetween;
the second and sixth wire stoppers face each other with the second wire guider therebetween;
the third and seventh wire stoppers face each other with the third wire guider therebetween; and
the fourth and eighth wire stoppers face each other with the fourth wire guider therebetween.

16. A display apparatus, comprising:
a display module comprising a flexible display panel;
a curvature-changing member configured to adjust a curvature of the display module; and
a bottom chassis in which is disposed the display module and the curvature-changing member,
wherein the curvature-changing member comprises
a wire;
a movement control part which moves the wire;
first to fourth wire guiders through which the wire passes, the first to fourth wire guiders disposed at predetermined intervals in a moving path of the wire to guide the moving path of the wire;
a curvature maintaining part between the second and third wire guiders, the curvature maintaining part maintaining a gap between the second and third wire guiders in the moving path of the wire; and
first and second wire stoppers which are coupled to the wire at predetermined intervals along a length of the wire, the first and second wire stoppers limiting the movement of the wire along the moving path.

17. The display apparatus of claim 16, wherein
the curvature-changing member further comprises:
first and third bending regions respectively defined between the first and second wire guiders and between the third and fourth wire guiders, and
a second bending region defined between the second and third wire guiders, the second bending region between the first and third bending regions along the moving path of the wire,
a force applied to the wire from the movement control part moves the wire in a first direction to change the curvature-changing member from an unbent state thereof to a bent state thereof, and
where the force applied to the wire from the first movement control part moves the wire in the first direction to change the curvature-changing member from the unbent state thereof to the bent state thereof,
a curvature of the second bending region is defined by the curvature maintaining part, and
a radius of curvature of the first bending region defined between the first and second wire guiders and a radius of curvature of the third bending region defined between the third and fourth wire guiders are limited by intervals between the first and second wire stoppers.

18. A display apparatus, comprising:
a display module comprising a flexible display panel;
a curvature-changing member configured to adjust a curvature of the display module;
a bottom chassis in which is disposed the display module and the curvature-changing member,
wherein the curvature-changing member comprises:
a wire;
a movement control part fixed at a first end of the curvature-changing member, to which opposing ends of the wire are coupled, the movement control part moving the wire in a first direction, and in a second direction opposite to the first direction;
a direction switching mechanism fixed at a second end of the curvature-changing member opposite to the first end thereof, the direction switching mechanism configured to allow switching of a moving direction of the wire between the first and second directions;
a flexible supporting part fixed at the second end of the curvature-changing member,
wherein an upper portion of the wire is disposed above an upper surface of the supporting part and a lower portion of the wire is disposed below a lower surface of the supporting part;
a plurality of wire guiders through which the wire passes, the plurality of wire guiders disposed at predetermined intervals in a moving path of the wire, the plurality of wire guiders disposed on the upper and the lower surfaces of the supporting part to guide the moving path of the wire;
a plurality of first wire stoppers which is coupled to the wire at predetermined intervals along a length of the wire disposed above the upper surface of the supporting part, the plurality of first wire stoppers disposed between first wire guiders disposed on the upper surface of the supporting part; and
a plurality of second wire stoppers which is coupled to the wire at predetermined intervals along a length of the wire disposed below the lower surface of the supporting part, the plurality of second wire stoppers disposed between second wire guiders disposed on the lower surface of the supporting part,
wherein the plurality of first and second wire stoppers limit the movement of the wire along the moving path, and
wherein in an unbent state of the curvature-changing member,
intervals between the first wire stoppers above the upper surface of the supporting part are substantially the same as intervals between the first wire guiders disposed on the upper surface of the supporting part; and
intervals between the second wire stoppers disposed below the lower surface of the supporting part are smaller than intervals between the second wire guiders disposed on the lower surface of the supporting part.

* * * * *